United States Patent [19]
Tanino

[11] Patent Number: 5,170,235
[45] Date of Patent: Dec. 8, 1992

[54] SEMICONDUCTOR INTEGRATED CIRCUIT

[75] Inventor: Noriyuki Tanino, Itami, Japan

[73] Assignee: Mitsubishi Denki Kabushiki Kaisha, Tokyo, Japan

[21] Appl. No.: 747,652

[22] Filed: Aug. 20, 1991

[30] Foreign Application Priority Data

Aug. 22, 1990 [JP] Japan .................. 2-223687

[51] Int. Cl.$^5$ ............................................. H01L 29/78
[52] U.S. Cl. ..................................... 257/276; 257/277
[58] Field of Search ......................................... 357/23.13

[56] References Cited

U.S. PATENT DOCUMENTS

| 5,027,181 | 6/1991 | Larik et al. | ......................... 357/23.13 |
| 5,028,819 | 7/1991 | Wei et al. | ........................... 357/23.13 |

FOREIGN PATENT DOCUMENTS

| 0098167 | 1/1984 | European Pat. Off. . |
| 0316799 | 5/1989 | European Pat. Off. . |
| 6130027 | 7/1984 | Japan . |
| 1-143502 | 6/1989 | Japan . |
| 2-56961 | 2/1990 | Japan . |

Primary Examiner—John D. Lee
Assistant Examiner—Robert E. Wise
Attorney, Agent, or Firm—Leydig, Voit & Mayer

[57] ABSTRACT

A semiconductor integrated circuit includes a field effect transistor on a dielectric substrate, a rear surface electrode on a rear surface of the dielectric substrate, a gate bias bonding pad for applying a bias to a gate of the field effect transistor, a current path between the pad and the gate impedance matched with the gate, and a via-hole connecting the source or the drain of the field effect transistor with the rear surface electrode. The current path and the rear surface electrode are electrically connected with each other by an auxiliary current path through a high resistance material that does not change the impedance at the gate. Thus, static electricity charging the gate bias bonding pad or a capacitor in the gate bias circuit during the fabrication process flows not through the gate of the FET but through the auxiliary current path, whereby the gate is protected from electrostatic breakdown.

11 Claims, 15 Drawing Sheets

SEMICONDUCTOR INTEGRATED CIRCUIT

FIELD OF THE INVENTION

The present invention relates to a semiconductor integrated circuit for processing a high frequency signal such as microwave signal, and more particularly to a structure of a microwave monolithic integrated circuit for preventing electrostatic breakdown in the fabrication process.

BACKGROUND OF THE INVENTION

FIG. 10 is a plan view showing a semiconductor integrated circuit, a high frequency switch, as an example of a semiconductor integrated circuit utilizing a dielectric substrate in accordance with the prior art. In FIG. 10, reference character $Q_1$ designates a field effect transistor (hereinafter referred to as 'FET') constructed on a dielectric substrate 1, which has a source S, a gate G, and a drain D. A first transmission line $T_1$ is connected to the gate G of the FET $Q_1$ and the electric length thereof is usually established at one fourth wavelength of the microwave signal, which enables impedance matching of the first transmission line $T_1$ with the gate G. A capacitor $C_1$ is connected to the first transmission line T1 and this is also connected to the grounding bonding pad $P_2$. A gate bias bonding pad $P_1$ is provided in contact with the node of the first transmission line $T_1$ and the first capacitor $C_1$. A second transmission line $T_2$ is connected to the source S of the FET $Q_1$. A via-hole V is provided for connecting the second transmission line $T_2$ with a rear surface electrode 4 produced at the rear surface of the dielectric substrate 1. Reference characters $M_1$ and $M_2$ designate transmission lines connected to the source S and the drain D of the FET $Q_1$, respectively.

FIG. 11 is a cross sectional view showing the device of FIG. 10 and schematically shows the FET, the via-hole, the connecting relation between them, and the transmission lines $T_1$ and $T_2$. FIG. 11 does not completely coincide with the plane pattern of FIG. 10. In FIG. 11, reference numeral 2 designates a semiconductor layer such as GaAs produced on a dielectric substrate 1 by an epitaxial growth method. An operating layer 3 of the FET $Q_1$ is produced in the semiconductor layer 2 by implanting n conductivity type dopant impurities such as silicon by ion implantation. A source electrode S and a drain electrode D are produced on the operating layer 3 and a gate electrode G is produced on the operating layer 3 and deposed between the gate and drain electrodes. Here, an insulating substrate comprising such as sapphire or alumina is used for the dielectric substrate 1, gold-germanium alloy is used for the source S and the drain D electrodes which are in ohmic contact with the operating layer 3, and aluminum is used for the gate electrode G which forms a Schottky barrier contact with the operating layer 3. The transmission lines $M_1$, $M_2$, $T_1$, and $T_2$ comprise metal material. Reference numeral 5 designates an insulating film on which the transmission lines $T_1$ and $T_2$ are produced. The other same reference numerals as those shown in FIG. 10 designate the same parts.

FIG. 12 shows an equivalent circuit of the above-described semiconductor integrated circuit. An RF input terminal 7 and an RF output terminal 8 are connected to the transmission lines $M_1$ and $M_2$, respectively. A gate bias voltage power supply 9 is connected to the gate bias bonding pad $P_1$. The other reference numerals that are the same as those shown in FIGS. 10 and 11 designate the same portions.

The operation will be described with reference to the equivalent circuit shown in FIG. 12.

A high frequency signal such as microwave signal is input to the RF input terminal 7, supplied to the FET $Q_1$ through the transmission line $M_1$, and output from the RF output terminal 8 through the transmission line $M_2$.

The transmission line $T_1$ and the capacitor $C_1$ form a gate bias circuit of the FET $Q_1$, and in this example a voltage bias is applied to the gate G of the FET from the gate bias power supply 9 which is provided outside the dielectric substrate 1, through the gate bias bonding pad $P_1$. Here, the electric length of the transmission line $T_1$ is usually established at one fourth wavelength of the microwave signal and the end terminal of the transmission line $T_1$ is grounded at high frequencies via the capacitor $C_1$. Therefore, viewed at the gate of the FET $Q_1$, the impedance of the transmission line $T_1$ becomes infinite, which prevents the microwave signal from leaking to the gate G of the FET through the gate-source or the gate-drain capacitance of the FET $Q_1$.

A resistor $R_1$ can be used instead of the transmission line $T_1$. In such case the value of the resistor $R_1$, typically 1 KΩ which is sufficiently higher than characteristic impedance of the transmission line $M_1$, typically 50 Ω, prevents the microwave signal from leaking to the gate G of the FET through the gate-source or gate-drain capacitance of the FET $Q_1$. Here, the resistor $R_1$ can be a semiconductor layer or a thin film resistor.

The capacitor $C_1$ also prevents a high frequency signal from being applied to the gate of the FET $Q_1$ from outside of the dielectric substrate 1 through the gate bonding pad $P_1$. Here, in the device of FIG. 12, although the capacitor $C_1$ is grounded at the rear surface electrode via the grounding bonding pad $P_2$, it can be grounded inside the dielectric substrate 1 using a via-hole.

The transmission line $T_2$ is part of a source voltage bias circuit of the FET $Q_1$ and, in this example, the source voltage bias circuit of the FET $Q_1$ is grounded at the rear surface electrode 4. The electrical length of the transmission line $T_2$ is established at one fourth wavelength of the microwave signal. Thus, similarly as in the case of the gate bias circuit, the microwave signal is prevented from leaking to the transmission line $T_2$ from the transmission line $M_1$. Here, when a second resistor $R_2$ is used in place of the transmission line $T_2$, establishing the value of the resistor $R_2$ at a value, typically 1 kΩ, sufficiently higher than the characteristic impedance of the transmission line $M_1$, typically 50 Ω prevents the leakage of the microwave signal.

In the semiconductor integrated circuit as described above, the attenuation of the microwave signal input from the RF input terminal 7 is controlled by varying the gate bias voltage of the FET $Q_1$, more concretely by varying the drain-source resistance of the FET $Q_1$ in a range from a sufficiently small value of several Ω to a sufficiently large value of several MΩ, thereby enabling producing of a signal from the RF output terminal 8.

In the above-described prior art example, the electrical length of the transmission line $T_2$ is established at one fourth wavelength, but a microwave switching circuit which can short-circuit or open circuit the microwave signal input from the RF output terminal 8 at the FET $Q_1$ can be obtained by directly grounding the source S of the FET $Q_1$ with the transmission line $T_2$ and the transmission line M1 can be dispensed with.

FIG. 13 is a plan view showing a semiconductor integrated circuit constituting a high frequency switch which is a prior art example of a semiconductor integrated circuit using a semi-insulating semiconductor substrate. FIG. 14 is a cross sectional view thereof and schematically shows the FET, the via-hole, and the connecting relation between them and the transmission lines $T_1$ and $T_2$. In FIG. 13, the same reference numerals as those shown in FIGS. 10 and 11 designate the same elements. A semi-insulating semiconductor substrate 14 is used in place of the dielectric substrate in the semiconductor integrated circuit shown in FIGS. 10 to 12 and the source S and the drain D of the FET $Q_1$ are connected to the rear surface electrode 4 via the substrate resistor 6. Here, because the bias circuit of the source S is provided externally, the second transmission line $T_2$ and the via-hole V are not used for connecting the source S to the rear surface electrode.

FIG. 15 shows an equivalent circuit of the semiconductor integrated circuit of FIG. 13. In FIG. 15, reference numeral 6 designates a substrate resistance between the source S, drain D and the rear surface electrode 4. The same reference numerals as those shown in FIG. 12 designate the same portions.

The operation of the circuit of FIG. 13 will be described with reference to the equivalent circuit of FIG. 15.

In the equivalent circuit of FIG. 15, since there is no transmission line $T_2$ and no via-hole V as shown in FIG. 12, source bias is applied from outside of the semi-insulating semiconductor substrate 1 using a circuit construction for applying DC bias such as a bias tee. In the case of using a semi-insulating semiconductor substrate 1, a substrate resistance 6 exists between the rear surface electrode 4 and the source S or the drain D of the FET as shown in FIG. 14, differently from the case of using a semi-insulating dielectric substrate such as sapphire substrate. The value of this substrate resistance 6 is usually more than 1 MΩ. Therefore, the circuit operation is similar to that of the equivalent circuit of FIG. 12.

The prior art semiconductor integrated circuit which has a construction as described above, where the gate of the FET $Q_1$ is insulated from the source or the drain of the FET $Q_1$ with respect to DC signals, has the following problem. That is, in a process of fabricating a semiconductor integrated circuit such as a chip separation process, pure water which flows over a wafer while cutting a semiconductor integrated circuit substrate with a dicing-saw causes electrostatic charging of the gate bias circuit, that is, electrification of the bonding pads for the gate, the source, and the drain which are not covered with passivation films, and this results electrostatic breakdown of the gate.

In Japanese Patent Publication No. Sho. 60-47469 is recited a Schottky gate field effect transistor in which a pn junction element having a series resistance lower than that of the gate electrode is connected in parallel with the gate electrode and the source or drain electrode, whereby the gate electrode is protected from an impulse voltage applied from the outside.

However, since the resistance of the pn junction element is smaller than the serial resistance of the gate, the impedance at the gate changes and impedance matching is not achieved in the microwave circuit. As a result, leakage or reflection of the input microwave signal arises.

In the Japanese Patent Publication No. Sho. 61-30078 is recited a microwave band high output transistor in which the gate electrode and the grounding electrode are connected to each other by a diffusion region produced directly below the gate pad and thus avoidance of the gate destruction is attempted. However, even in this construction the resistance value of the diffusion region is only about 200 Ω, and there also arises a problem of impedance mismatching.

SUMMARY OF THE INVENTION

The present invention is directed to solving the above described problems and has for its object to provide a semiconductor integrated circuit that prevents the electrification of the gate bias circuit without impedance mismatching at the gate. The destruction caused by the electrification of the gate of the FET in the gate fabrication process of a field effect transistor is also prevented.

Other objects and advantages of the present invention will become apparent from the detailed description given hereinafter; it should be understood, however, that the detailed description and specific embodiment are given by way of illustration only since various changes and modifications within the spirit and the scope of the invention will become apparent to those skilled in the art from this detailed description.

In accordance with an aspect of the present invention, a semiconductor integrated circuit comprises a field effect transistor constructed on a dielectric substrate, a rear surface electrode produced on a rear surface of the substrate and connected to a source or drain of the field effect transistor, and a gate bias bonding pad for applying a bias to the gate of the FET. In such a construction, the current path between the gate and its bias bonding pad is connected to the rear surface electrode by an auxiliary current path comprising a high resistance material which changes the impedance of the gate very little.

In accordance with another aspect of the present invention, the auxiliary current path comprises an electrode wiring which is produced at a surface region of the semi-insulating semiconductor substrate and is in ohmic contact therewith.

In accordance with an aspect of the present invention, static electricity charging to the gate bias bonding pad or the capacitor constituting the gate bias circuit in the fabrication process flows not through the gate of the FET but through the auxiliary current path, whereby the gate can be protected from the electrostatic breakdown.

In accordance with another aspect of the present invention, the substrate resistance of the semi-insulating semiconductor substrate functions similarly as the auxiliary current path and a via-hole can be dispensed with, thereby the construction is simplified.

DETAILED DESCRIPTION OF THE PREFERRED EMBODIMENT

An embodiment of the present invention will be described in detail with reference to the drawings.

Figure 1:
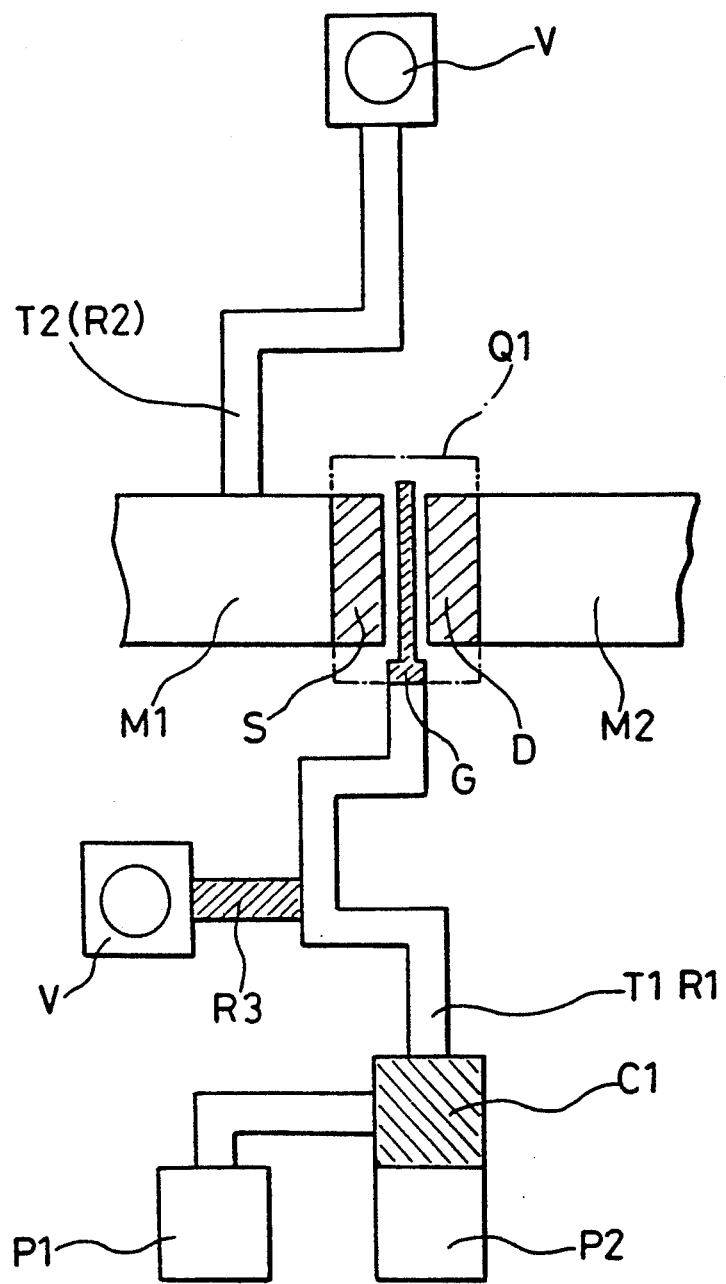
FIG. 1 is a plan view showing a semiconductor integrated circuit in accordance with a first embodiment of the present invention.
Figure 2:
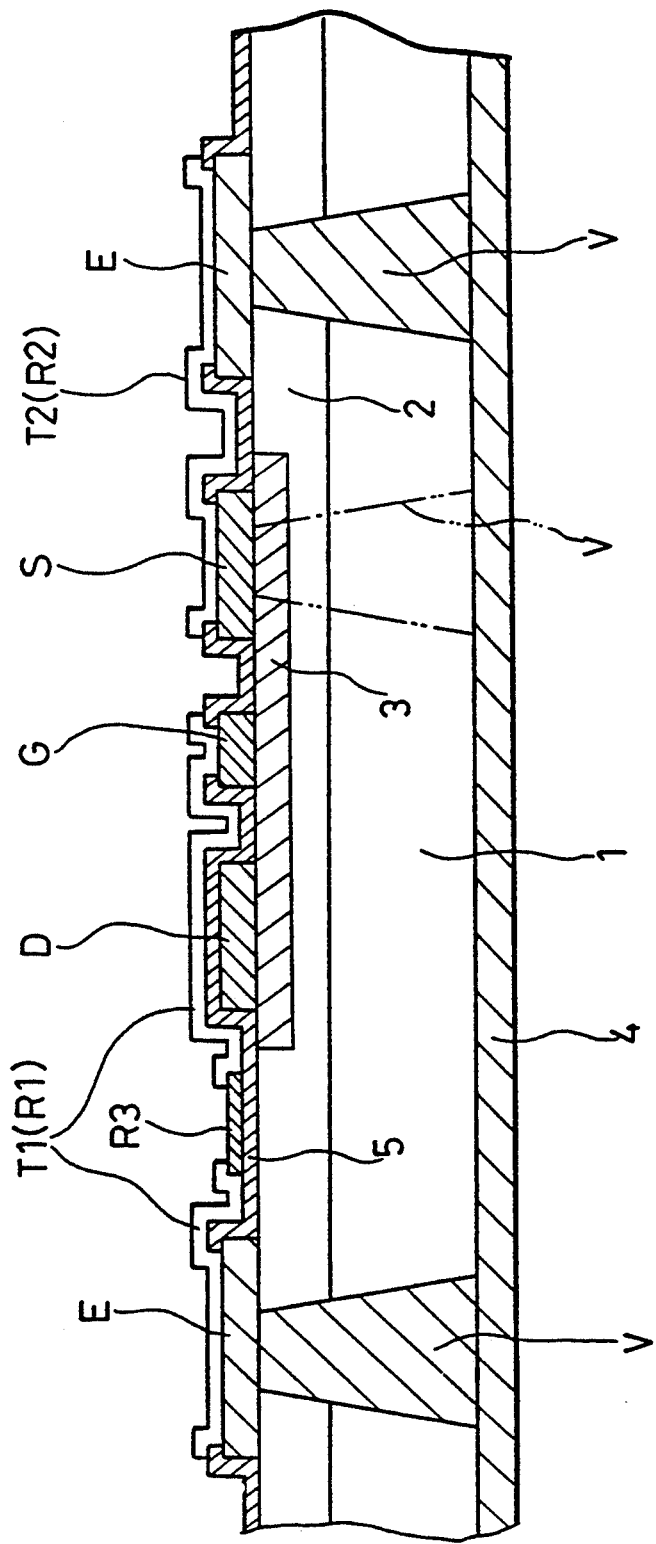
FIG. 2 is a diagram schematically showing the cross sectional structure of the circuit of FIG. 1.
Figure 3:
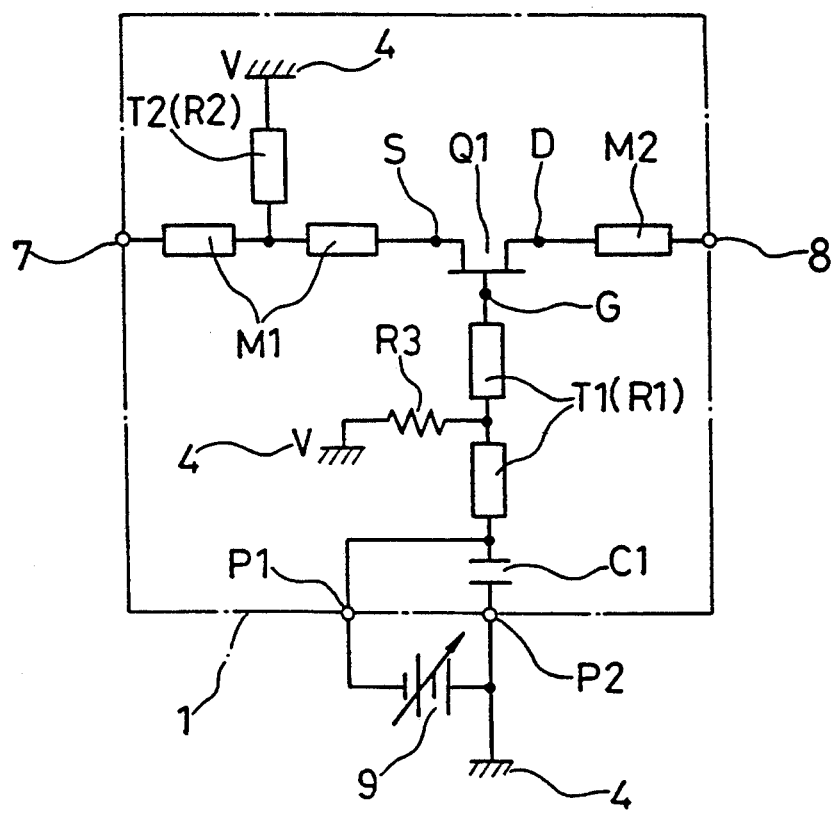
FIG. 3 is a diagram showing an equivalent circuit of the circuit of FIG. 1.
Figure 10:
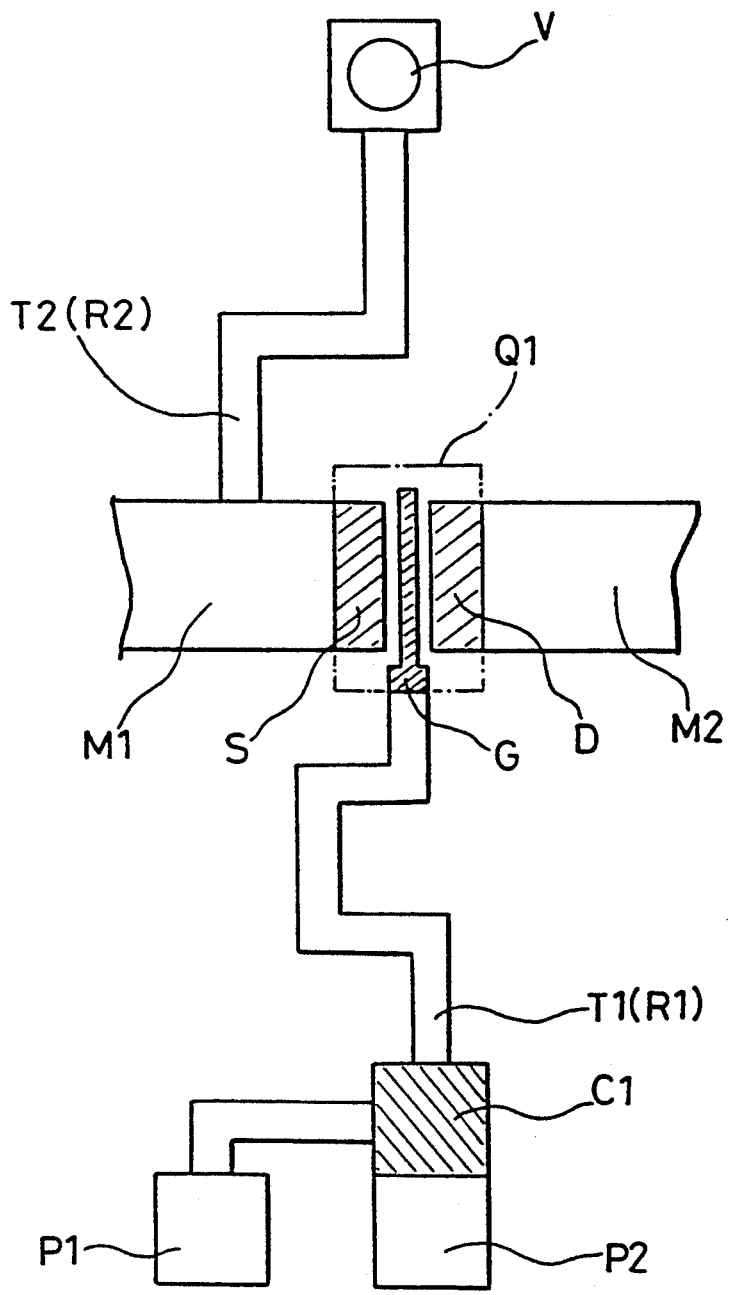
FIG. 10 is a plan view showing a high frequency switch as an example of a prior art semiconductor integrated circuit using a dielectric substrate.
Figure 11:
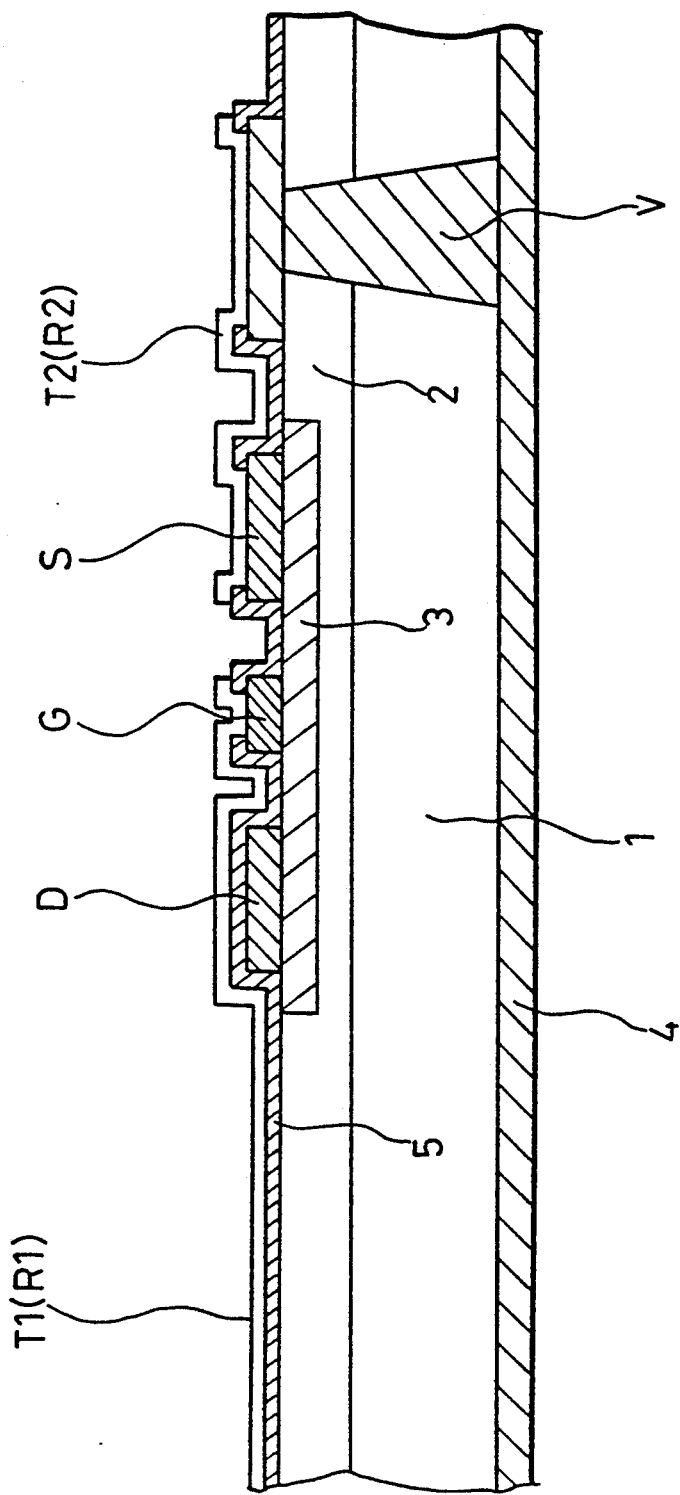
FIG. 11 is a diagram schematically showing a cross sectional structure of the circuit of FIG. 10.
Figure 12:
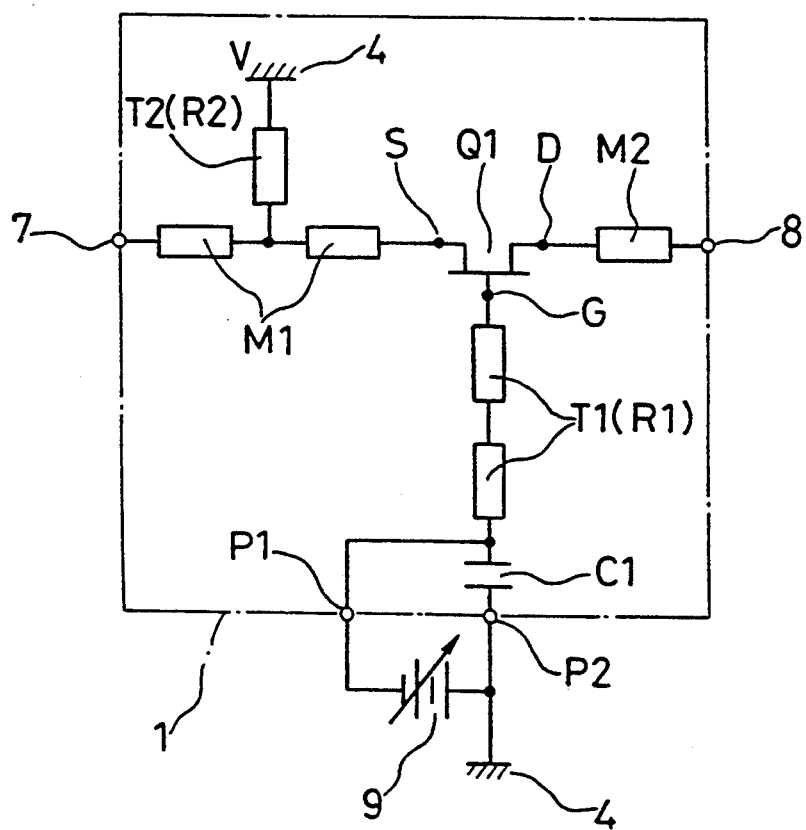
FIG. 12 is a diagram showing an equivalent circuit of the circuit of FIG. 10.
Figure 13:
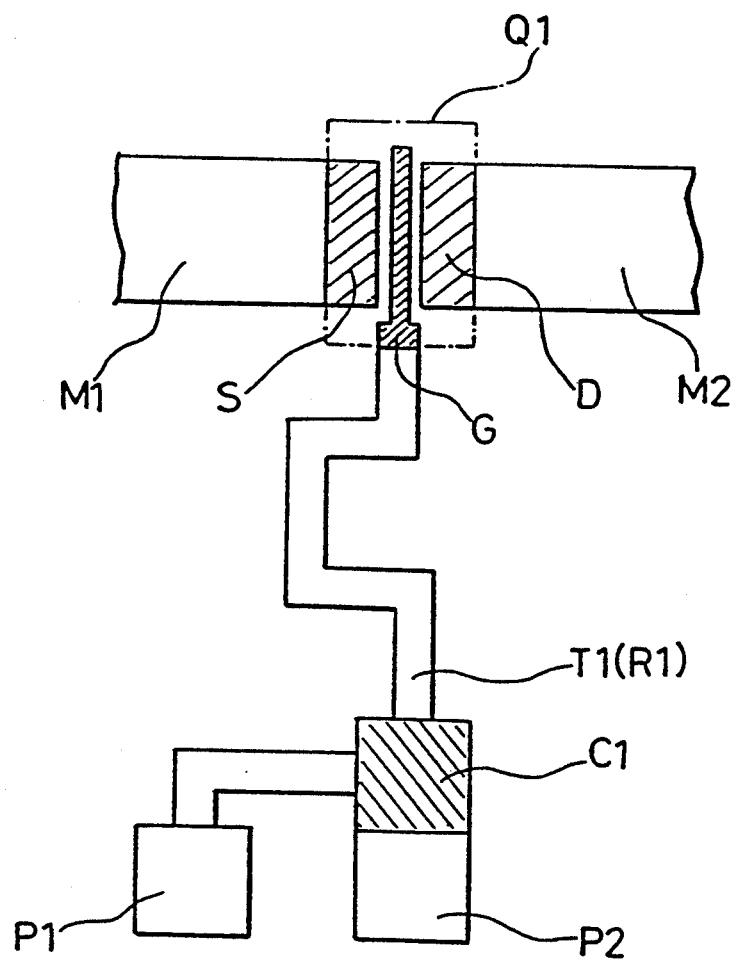
FIG. 13 is a plan view showing a high frequency switch as an example of a prior art semiconductor integrated circuit using a semi-insulating semiconductor substrate.
Figure 14:
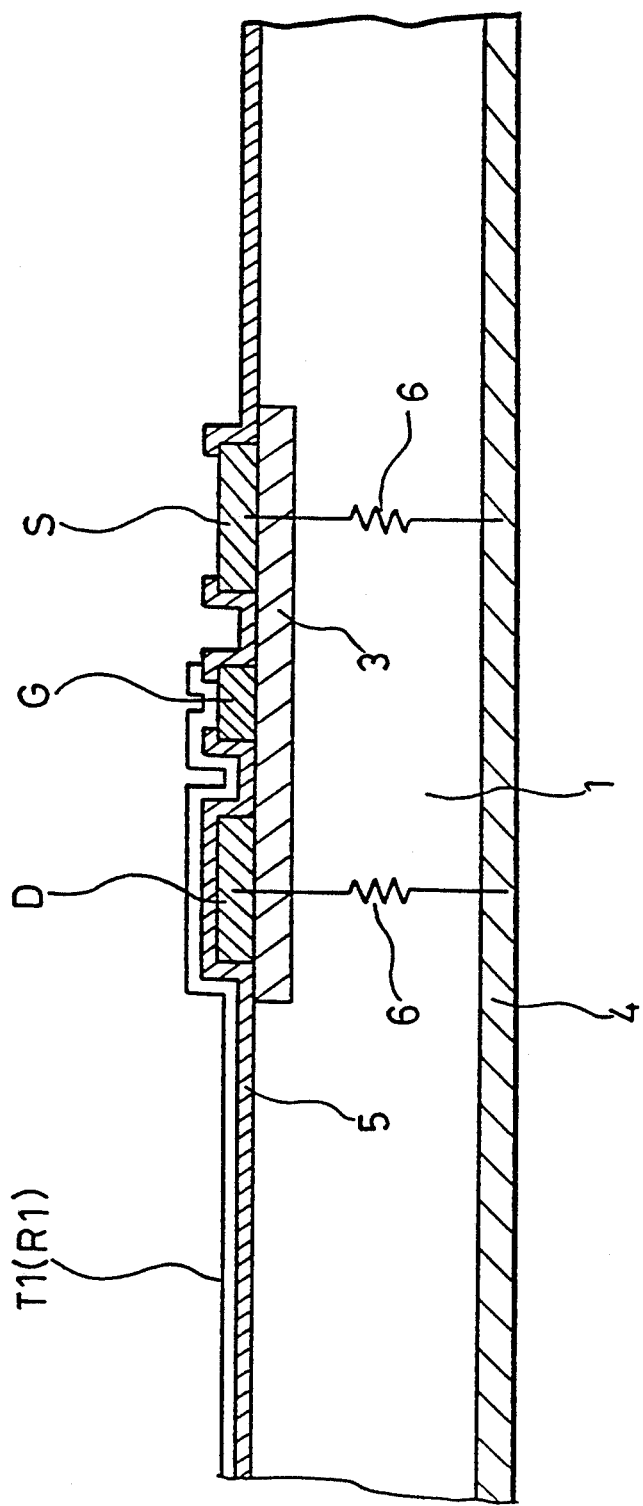
FIG. 14 is a diagram schematically showing a cross sectional structure of the circuit of FIG. 13.
Figure 15:
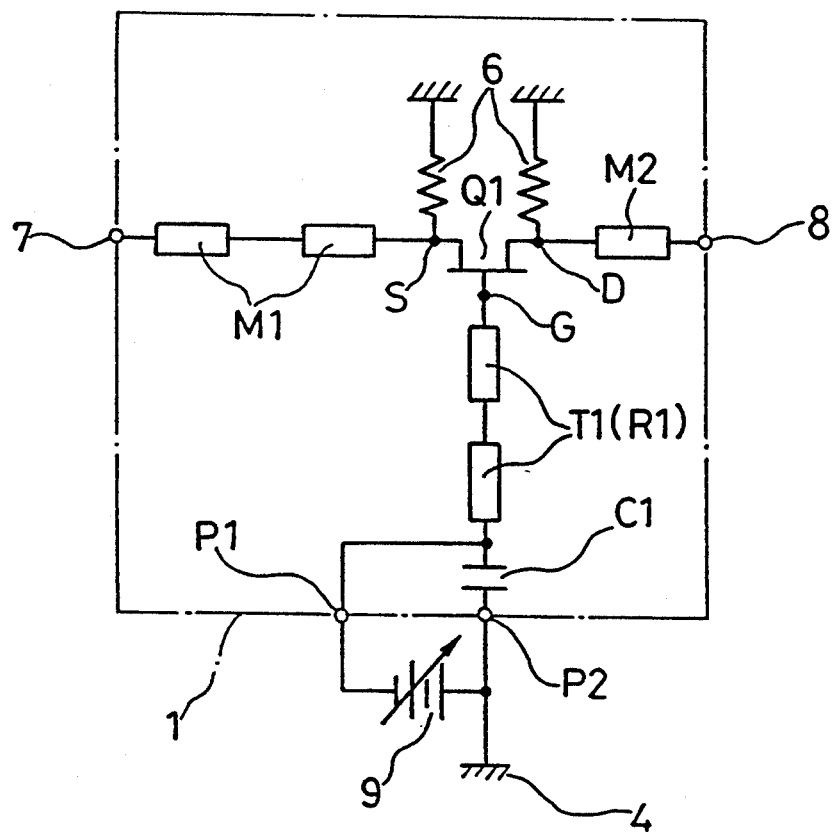
FIG. 15 is a diagram showing an equivalent circuit of the circuit of FIG. 13.

FIG. 1 shows a high frequency switch semiconductor integrated circuit using a dielectric substrate, in accordance with a first embodiment of the present invention. FIG. 2 is a cross sectional view thereof showing the FET, the via-hole, the connecting relation between them, and the transmission lines $T_1$ and $T_2$. FIG. 3 shows an equivalent circuit thereof. These FIGS. 1 to 3 correspond to FIGS. 10 to 12 which show a prior art example and the same reference numerals designate the same or corresponding elements. In this first embodiment of the invention, the first transmission line $T_1$ is connected to the rear surface electrode via the third resistor $R_3$ of about 100KΩ. This resistor $R_3$ has a sufficiently high resistance value as described above and has almost no influence on the gate bias circuit.

In other words, a via-hole $V_1$ is produced in the vicinity of the transmission line $T_1$. A third resistor $R_3$ comprising a refractory metal silicide layer such as nichrome (alloy of nickel and chrome), tungsten silicide, or molybdenum silicide, is produced on an insulating film 5 between the via-hole V and the transmission line $T_1$. This resistor $R_3$ is connected to the transmission line T1 at one of the ends of the resistor and to the rear surface electrode 4 through the via-hole V at the other end of the resistor.

The fabrication process will be described.

First of all, a GaAs semiconductor layer 2 is epitaxially grown on a wafer substrate 1 comprising such as sapphire, and subsequently an n conductivity type depart impurity such as silicon is ion implanted into the GaAs semiconductor layer 2 to produce an operating layer 3 at the surface of the semiconductor layer 2.

Next, a gold-germanium alloy layer is patterned on the operating layer 3 and a source S electrode and a drain D electrode are produced from the gold-germanium alloy layer. Thereafter, an aluminum layer is patterned to produce a gate G. Then, an electrode layer E comprising gold is produced at a position corresponding to the via-hole which is produced in a later process.

Next, an insulating film 5 is patterned on the entire surface, a third resistor layer $R_3$ comprising the above described refractory metal silicide layer is patterned, and then first and second transmission lines $T_1$ and $T_2$, transmission lines $M_1$ and $M_2$, and gate bonding pads $P_1$ and $P_2$, all comprising metal material, are produced. At this time, the capacitor $C_1$ is also produced and portions other than the bonding pad portion are covered by a passivation film.

Thereafter, the sapphire substrate 1 is etched from the rear surface side to a predetermined thickness, a via-hole V is produced by etching, and the entire surface of the via hole is gold plated so as to bury the via-hole and produce a rear surface electrode 4.

Then, the wafer substrate is separated into chips by a dicing-saw.

The function and effect of this embodiment will be described.

Although the semiconductor integrated circuit is devised so as to be able to suppress the generation of static electricity in the fabrication process, there are some cases where sufficient countermeasures cannot be implemented. In a case where chip separation with a dicing-saw is implemented, it is necessary to spray pure water on the dielectric substrate at a high pressure in order to wash out the dust generated by cutting. However, because the pure water has high resistance and is likely to be electrically charged, electrode portions such as an exposed bonding pad produced on the dielectric substrate is easily electrified by charges conveyed by the pure water.

In such case, in the semiconductor integrated circuit of this embodiment, since the gate G of the FET $Q_1$ is grounded at the rear surface electrode 4 via the third resistor $R_3$, charges conveyed by the pure water flow to the rear surface electrode 4 through the third resistor $R_3$ and the gate G does not reach a high voltage due to static electricity. Because the source S of the FET $Q_1$ is connected to the rear surface electrode 4 through the via-hole V, the source S does not have a high voltage due to electrification, either. Further, although the drain D of the FET $Q_1$ in this embodiment is not connected to the rear surface electrode 4 via a bias circuit, the drain D of a normally-on transistor, which is usually a GaAs FET when used for microwave signals, is connected to the source S through the operating layer 3, which means the drain D is grounded at the rear surface electrode 4 through the source S so that the drain D does not have a high voltage due to electrification, either.

Electrostatic breakdown of the gate due to electrification in the fabrication process is prevented because the gate G, the source S, and the drain D of the FET $Q_1$ are grounded at the rear surface electrode directly or via the resistor.

While in the above illustrated embodiment the source is grounded at the rear surface electrode through a second transmission line, not a source but a drain can be grounded. Furthermore, either the source or drain electrode can be grounded directly to the rear surface electrode not through the transmission line but through a via-hole which is produced directly below the source or the drain represented by broken lines in FIG. 2.

In the above illustrated embodiment, the gate G and the capacitor $C_1$ are connected by a first transmission line and the source S and the rear surface electrode 4 are connected by a second transmission line, respectively, but they can be connected by first and second resistors $R_1$ and $R_2$, respectively as explained in the prior art.

Figure 4:
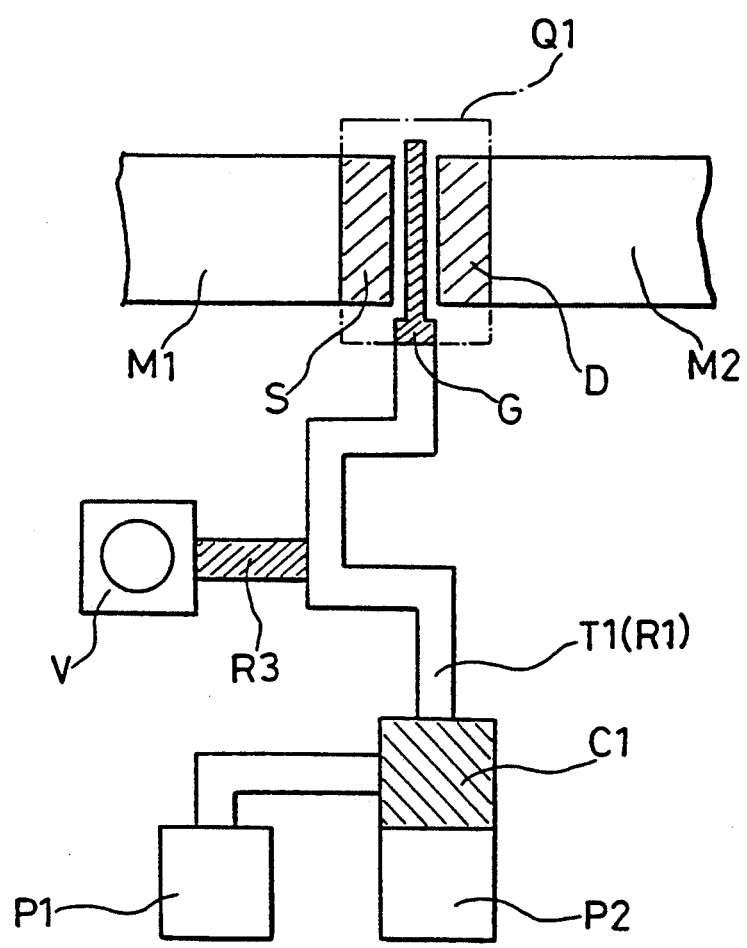
FIG. 4 is a plan view showing a semiconductor integrated circuit in accordance with a second embodiment of the present invention.
Figure 5:
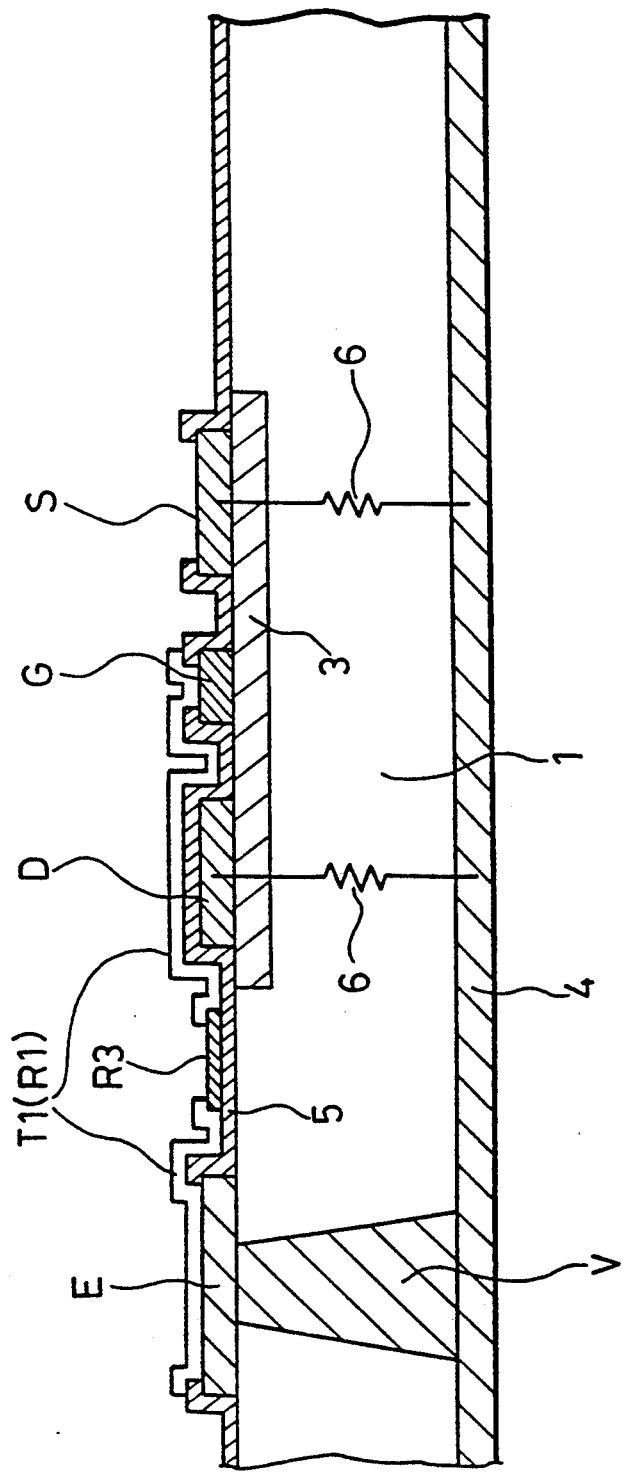
FIG. 5 is a diagram schematically showing a cross sectional structure of the circuit of FIG. 4.
Figure 6:
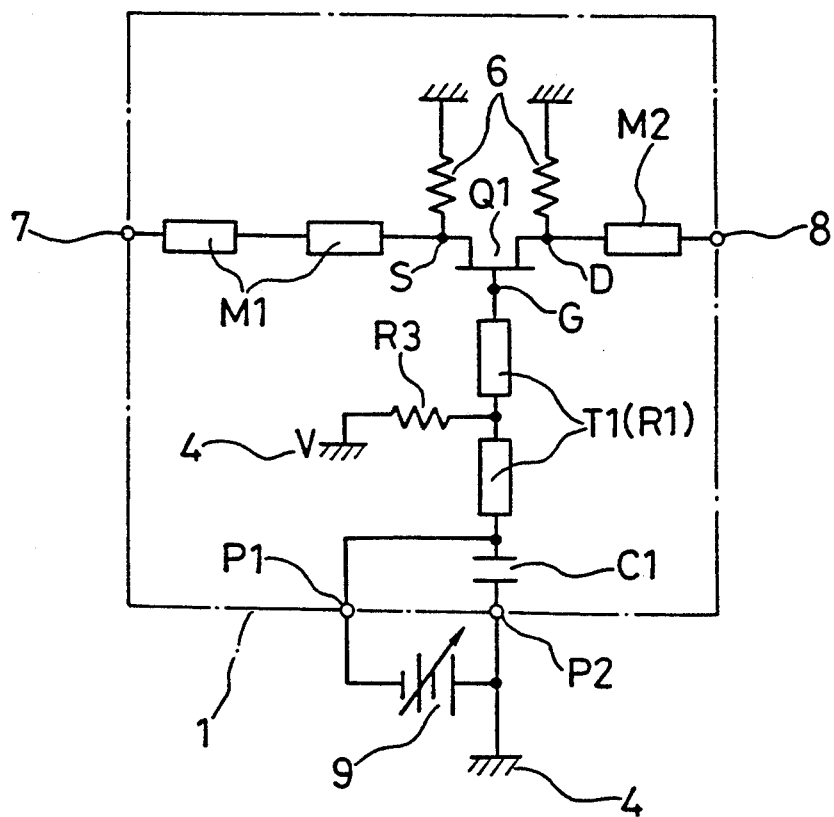
FIG. 6 is a diagram showing an equivalent circuit of the circuit of FIG. 4.

FIGS. 4, 5, and 6 show a second embodiment of the present invention. This second embodiment is a constituting a high frequency switch using a semi-insulating semiconductor substrate. FIGS. 4, 5, and 6 are a plan view, a cross sectional view, and an equivalent circuit diagram corresponding to FIGS. 1, 2, and 3, respectively. A semi-insulating semiconductor substrate 14 is used in place of the insulating dielectric substrate in the semiconductor integrated circuit of the first embodiment and the source S and the drain D of the FET $Q_1$ are connected to the rear surface electrode via the substrate resistance 6. Further, since the bias circuit of the source S is provided externally, a second transmission line $T_2$ and a via-hole V for connecting the source S to the rear surface electrode are not used.

The function and effect of this embodiment will be described.

Similarly as in the first embodiment, the gate G of the FET $Q_1$ is grounded at the rear surface electrode 4 through the third resistor $R_3$, therefore, the charges conveyed by pure water used for washing during the semiconductor fabrication process flow into the rear surface electrode through the third resistor so that the gate G does not reach a high voltage due to static electricity.

Although the source S of the FET $Q_1$ is not connected to the rear surface electrode 4 through the via-hole V differently from first embodiment, the semi-insulating semiconductor substrate 1 is used as a dielectric substrate and the source S and the drain D are grounded at the rear surface electrode 4 via the substrate resistance 6. Therefore, neither the source S nor the drain D reaches a high voltage due to static electricity.

Electrostatic breakdown of the gate caused by the electrification in the fabrication process is prevented because the gate G, the source S, and the drain D of the FET $Q_1$ are grounded at the rear surface electrode directly or via a resistance.

Figure 7:
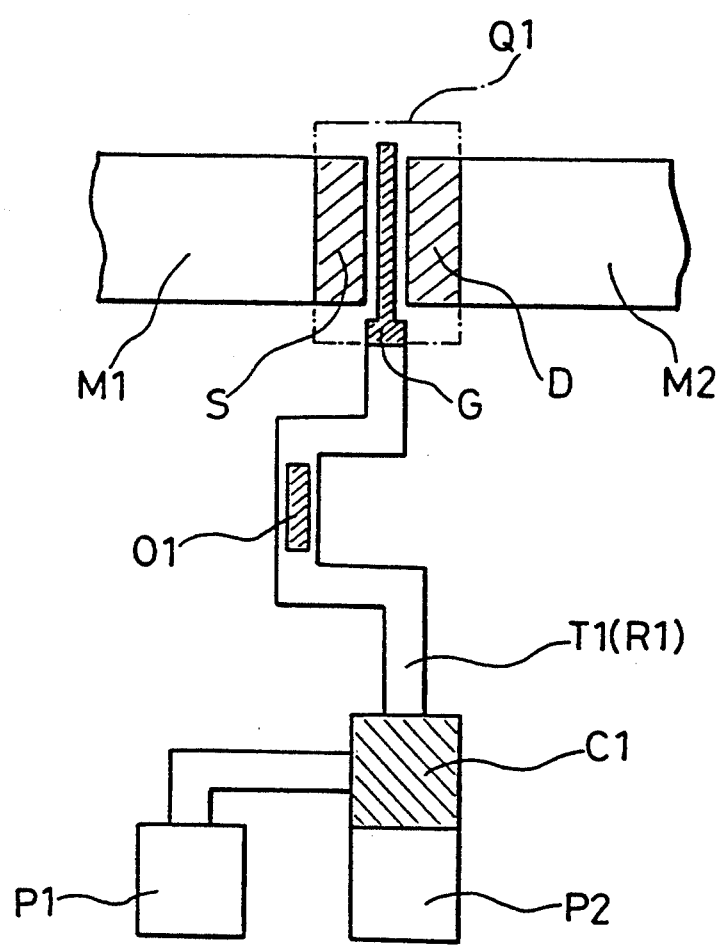
FIG. 7 is a plan view showing a semiconductor integrated circuit in accordance with a third embodiment of the present invention.
Figure 8:
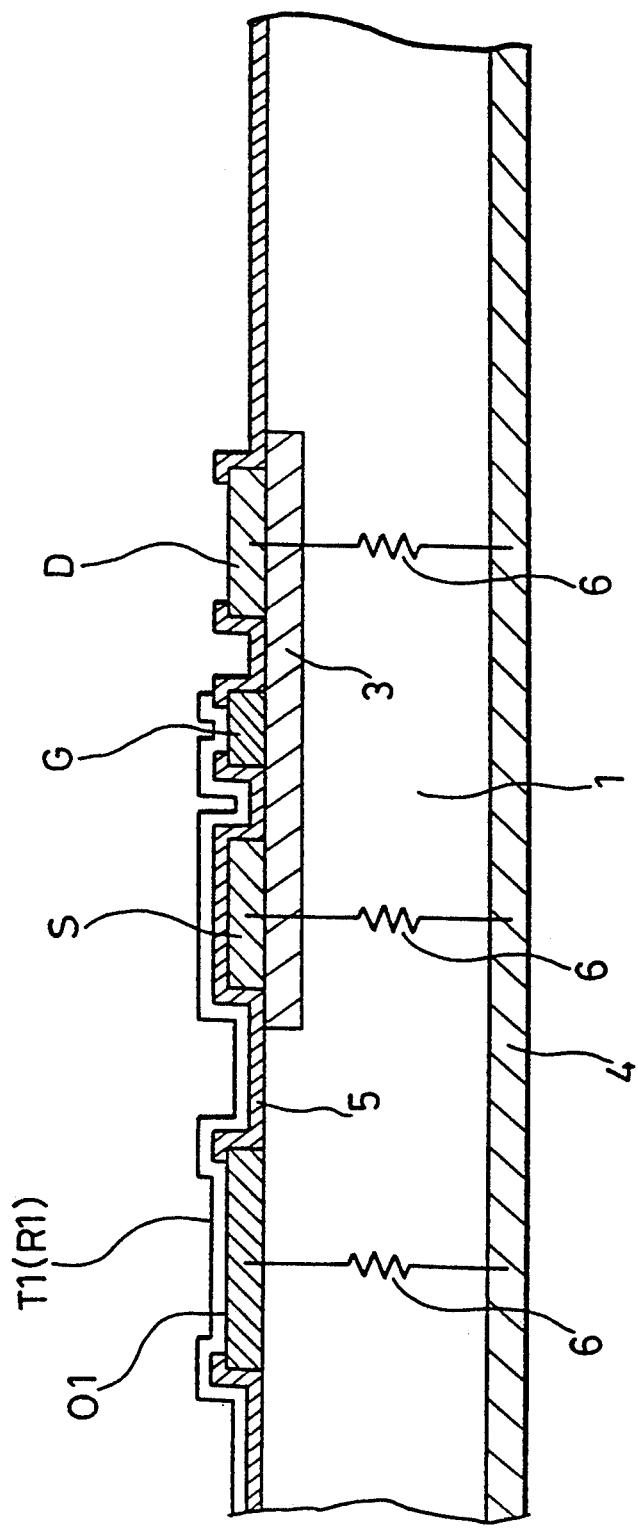
FIG. 8 is a diagram schematically showing a cross sectional structure of the circuit of FIG. 7.
Figure 9:
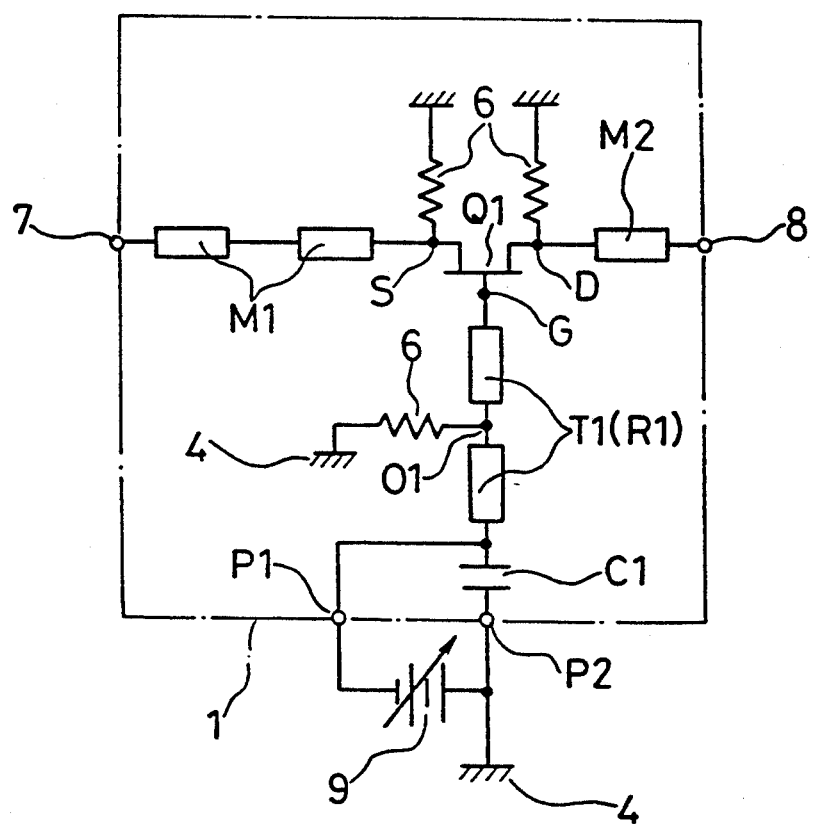
FIG. 9 is a diagram showing an equivalent circuit of the circuit of FIG. 7.

FIGS. 7, 8, and 9 show a plan view, a cross sectional view, and an equivalent circuit diagram of a semiconductor integrated circuit in accordance with a third embodiment of the present invention, which correspond to FIGS. 4, 5, and 6, respectively. In this third embodiment, an ohmic electrode $O_1$ is produced below a portion of the first transmission line $T_1$ and thus the gate G and the rear surface electrode 4 are connected with each other. In this case, the ohmic electrode $O_1$ has sufficiently large area so that the electric resistance between the gate G and the rear surface electrode 4 is as small as the substrate resistance 6. The other construction is the same as those of the second embodiment.

The function and effect of this embodiment will be described.

In this embodiment, differently from the first embodiment, the source S of the FET $Q_1$ is not connected to the rear surface electrode 4 through the via-hole V. However, similarly as in the second embodiment, since the semi-insulating semiconductor substrate 1 is used as a dielectric substrate, the source S and the drain D are connected to the rear surface electrode 4 via the substrate resistance 6 and neither of them reaches a high voltage due to static charging.

Furthermore, since a portion of the first transmission line $T_1$ is in contact with the semi-insulating semiconductor substrate 1 using the ohmic electrode $O_1$, the gate G of the FET $Q_1$ is grounded at the rear surface electrode 4 via the substrate resistance 6 and the gate G does not reach a high voltage due to electrification.

In this way, the gate G, the source S and the drain D of the FET $Q_1$ are grounded at the rear surface electrode directly or via a resistance, and electrostatic breakdown of the gate due to electrification is prevented.

While a high frequency switch circuit is shown as an example of a semiconductor integrated circuit in the above illustrated embodiments, an amplifier, an oscillator, a phase-shifter, or an attenuator can be adopted in place of a switch, and a microwave semiconductor integrated circuit having a gate bias circuit similar to the above illustrated embodiment can be used with the same effects.

In the above illustrated first and second embodiments, a third resistor comprising a refractory metal silicide is produced on the insulating film on the substrate, but in a case where a semi-insulating semiconductor substrate is used as shown in the second embodiment, the third resistor can be produced by ion implantation at the surface of the substrate.

As is evident from the foregoing description, according to the present invention, a gate bias circuit of a field effect transistor is connected to the rear surface electrode via a high resistance auxiliary current path. Therefore, static electricity charging the gate bias bonding pad and the capacitor constituting the gate bias circuit flows through the auxiliary current path and almost no static electricity flows to the gate of the FET, so that electrostatic breakdown of the gate in the semiconductor fabrication process is prevented. The auxiliary current path is constructed of an electrode wiring which is in ohmic contact with the semi-insulating semiconductor substrate, and thus the substrate resistance of a semi-insulating semiconductor substrate functions similarly as the above described auxiliary current path. Therefore, the via-hole or wiring for connecting a gate with a rear surface electrode can be dispensed with, whereby construction is simplified.

What is claimed is:

1. A semiconductor integrated circuit comprising:
   a dielectric substrate having opposed front and rear surfaces;
   a field effect transistor disposed on the front surface of said dielectric substrate having a source, a gate, and a drain, said gate having an impedance;
   a rear surface electrode disposed on the rear surface of said dielectric substrate;
   a gate bias bonding pad disposed on the front surface of said dielectric substrate and electrically connected to said gate for applying a bias to said gate of said field effect transistor;
   a current path electrically connecting said gate bias bonding pad and said gate and having substantially the same impedance as said gate;
   an electrically conducting via-hole extending through said dielectric substrate connecting one of the source and drain of said field effect transistor with said rear surface electrode; and
   an auxiliary current path electrically connecting said current path with said rear surface electrode, said auxiliary current path comprising a high resistance material not altering the impedance of said the gate.

2. A semiconductor integrated circuit as defined in claim 1 comprising:
a semiconductor layer disposed on the front surface of said dielectric substrate; and
an active layer disposed in said semiconductor layer wherein said source and drain are disposed on said active layer and said gate is disposed between said source and said drain.

3. A semiconductor integrated circuit as defined in claim 1 wherein said via-hole is disposed directly opposite one of said source and said drain.

4. A semiconductor integrated circuit as defined in claim 1 including a capacitor connected to said gate bias bonding pad.

5. A semiconductor integrated circuit as defined in claim 1 wherein said current path comprises one of a transmission line and a resistor.

6. A semiconductor integrated circuit as defined in claim 1 wherein said field effect transistor is a high frequency switch.

7. A semiconductor integrated circuit as defined in claim 1 wherein said auxiliary current path comprises a resistor including a refractory metal silicide which is produced on a semi-insulating film on the substrate, or a resistor produced by an ion implantation at a surface portion of said substrate.

8. A semiconductor integrated circuit as defined in claim 1 including an electrode layer spaced from at least one of said source and said drain and electrically connected through a second current path to one of said source and drain wherein said via-hole is disposed directly opposite said electrode layer.

9. A semiconductor integrated circuit comprising:
a semi-insulating semiconductor substrate having opposed front and rear surfaces;
a field effect transistor disposed on the front surface of said semi-insulating semiconductor substrate having a source, a gate, and a drain, said gate having an impedance;
a rear surface electrode disposed on the rear surface of said semi-insulating semiconductor substrate;
a gate bias bonding pad disposed on the front surface of said semi-insulating semiconductor substrate and electrically connected to said gate for applying a bias to said gate of said field effect transistor;
a current path electrically connecting said gate bias bonding pad and said gate and having substantially the same impedance as said gate;
an electrically conducting via-hole extending through said semi-insulating semiconductor substrate connecting one of the source and drain of said field effect transistor with said rear surface electrode; and
an auxiliary current path electrically connecting said current path with said rear surface electrode, said auxiliary current path comprising a wiring on the front surface of said semi-insulating semiconductor substrate making an ohmic contact with said semi-insulating semiconductor substrate.

10. A semiconductor integrated circuit as defined in claim 9 comprising an active layer disposed at the front surface of said semi-insulating semiconductor substrate wherein said source and drain are disposed on said active layer and said gate is disposed between said source and said drain.

11. A semiconductor integrated circuit as defined in claim 9 wherein said substrate has a resistance and said wiring has a sufficiently large area that the resistance between the gate and the rear surface electrode is a small as the substrate resistance.

* * * * *